US007989280B2

(12) United States Patent
Brask et al.

(10) Patent No.: US 7,989,280 B2
(45) Date of Patent: Aug. 2, 2011

(54) DIELECTRIC INTERFACE FOR GROUP III-V SEMICONDUCTOR DEVICE

(75) Inventors: Justin K. Brask, Portland, OR (US);
Suman Datta, Beaverton, OR (US);
Mark L. Doczy, Beaverton, OR (US);
James M. Blackwell, Portland, OR (US); Matthew V. Metz, Hillsboro, OR (US); Jack T. Kavalieros, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/338,839

(22) Filed: Dec. 18, 2008

(65) Prior Publication Data

US 2009/0095984 A1 Apr. 16, 2009

Related U.S. Application Data

(62) Division of application No. 11/292,399, filed on Nov. 30, 2005, now Pat. No. 7,485,503.

(51) Int. Cl.
*H01L 21/336* (2006.01)
(52) U.S. Cl. ........ 438/197; 438/216; 438/287; 257/189; 257/E21.398; 257/E21.386; 257/E21.451
(58) Field of Classification Search .................. 438/197, 438/216, 287; 257/189, E21.398, E21.386, 257/E21.451
See application file for complete search history.

(56) References Cited

U.S. PATENT DOCUMENTS

| | | | |
|---|---|---|---|
| 4,231,149 A | 11/1980 | Chapman et al. |
| 4,487,652 A | 12/1984 | Almgren |
| 4,711,701 A | 12/1987 | McLevige |
| 4,751,201 A | 6/1988 | Nottenburg et al. |
| 4,818,715 A | 4/1989 | Chao |
| 4,871,692 A | 10/1989 | Lee et al. |
| 4,872,046 A | 10/1989 | Morkoc et al. |
| 4,905,063 A | 2/1990 | Beltram et al. |
| 4,906,589 A | 3/1990 | Chao |
| 4,907,048 A | 3/1990 | Huang |
| 4,914,059 A | 4/1990 | Nissim et al. |
| 4,994,873 A | 2/1991 | Madan |
| 4,996,574 A | 2/1991 | Shirasaki et al. |
| 5,023,203 A | 6/1991 | Choi |
| 5,120,666 A | 6/1992 | Gotou |
| 5,124,777 A | 6/1992 | Lee |

(Continued)

FOREIGN PATENT DOCUMENTS

DE 10203998 8/2003
(Continued)

OTHER PUBLICATIONS

Mistele et al., "Incorporation of Dielectric Layers into the Processing of III-Nitride-based Heterostructure Field-Effect Transistors", J. Electronic Materials, 32, 2003, pp. 355-363.*

(Continued)

*Primary Examiner* — Asok K Sarkar
*Assistant Examiner* — Julia Slutsker
(74) *Attorney, Agent, or Firm* — Blakely, Sokoloff, Taylor & Zafman LLP

(57) ABSTRACT

A Group III-V Semiconductor device and method of fabrication is described. A high-k dielectric is interfaced to a confinement region by a chalcogenide region.

11 Claims, 6 Drawing Sheets

U.S. PATENT DOCUMENTS

| | | | |
|---|---|---|---|
| 5,179,037 A | 1/1993 | Seabaugh | |
| 5,216,271 A | 6/1993 | Takagi et al. | |
| 5,278,102 A | 1/1994 | Horie | |
| 5,308,999 A | 5/1994 | Gotou | |
| 5,328,810 A | 7/1994 | Lowrey et al. | |
| 5,338,959 A | 8/1994 | Kim et al. | |
| 5,346,836 A | 9/1994 | Manning et al. | |
| 5,346,839 A | 9/1994 | Sundaresan | |
| 5,357,119 A | 10/1994 | Wang et al. | |
| 5,391,506 A | 2/1995 | Tada et al. | |
| 5,428,237 A | 6/1995 | Yuzurihara et al. | |
| 5,466,621 A | 11/1995 | Hisamoto et al. | |
| 5,475,869 A | 12/1995 | Gomi et al. | |
| 5,479,033 A | 12/1995 | Baca et al. | |
| 5,482,877 A | 1/1996 | Rhee | |
| 5,495,115 A | 2/1996 | Kudo et al. | |
| 5,514,885 A | 5/1996 | Myrick | |
| 5,521,859 A | 5/1996 | Ema et al. | |
| 5,543,351 A | 8/1996 | Hirai et al. | |
| 5,545,586 A | 8/1996 | Koh | |
| 5,563,077 A | 10/1996 | Ha | |
| 5,576,227 A | 11/1996 | Hsu | |
| 5,578,513 A | 11/1996 | Maegawa | |
| 5,595,919 A | 1/1997 | Pan | |
| 5,595,941 A | 1/1997 | Okarnoto et al. | |
| 5,652,454 A | 7/1997 | Iwamatsu et al. | |
| 5,658,806 A | 8/1997 | Lin et al. | |
| 5,665,203 A | 9/1997 | Lee et al. | |
| 5,682,048 A | 10/1997 | Shinohara et al. | |
| 5,698,869 A | 12/1997 | Yoshimi et al. | |
| 5,701,016 A | 12/1997 | Burroughes et al. | |
| 5,716,879 A | 2/1998 | Choi et al. | |
| 5,739,544 A | 4/1998 | Yuki et al. | |
| 5,760,442 A | 6/1998 | Shigyo et al. | |
| 5,770,513 A | 6/1998 | Okaniwa et al. | |
| 5,773,331 A | 6/1998 | Solomon et al. | |
| 5,776,821 A | 7/1998 | Haskell et al. | |
| 5,793,088 A | 8/1998 | Choi et al. | |
| 5,804,848 A | 9/1998 | Mukai | |
| 5,811,324 A | 9/1998 | Yang | |
| 5,814,895 A | 9/1998 | Hirayama et al. | |
| 5,821,629 A | 10/1998 | Wen et al. | |
| 5,827,769 A | 10/1998 | Aminzadeh et al. | |
| 5,844,278 A | 12/1998 | Mizuno et al. | |
| 5,856,225 A | 1/1999 | Lee et al. | |
| 5,859,456 A | 1/1999 | Efland et al. | |
| 5,880,015 A | 3/1999 | Hata | |
| 5,883,564 A | 3/1999 | Partin | |
| 5,888,309 A | 3/1999 | Yu | |
| 5,889,304 A | 3/1999 | Watanabe | |
| 5,899,710 A | 5/1999 | Mukai | |
| 5,905,285 A | 5/1999 | Gardner et al. | |
| 5,908,313 A | 6/1999 | Chau et al. | |
| 5,952,701 A | 9/1999 | Bulucea | |
| 5,965,914 A | 10/1999 | Miyamoto | |
| 5,976,767 A | 11/1999 | Li | |
| 5,981,400 A | 11/1999 | Lo | |
| 5,985,726 A | 11/1999 | Yu et al. | |
| 6,013,926 A | 1/2000 | Oku et al. | |
| 6,018,176 A | 1/2000 | Lim | |
| 6,031,249 A | 2/2000 | Yamazaki et al. | |
| 6,051,452 A | 4/2000 | Shigyo et al. | |
| 6,054,355 A | 4/2000 | Inumiya et al. | |
| 6,063,675 A | 5/2000 | Rodder | |
| 6,063,677 A | 5/2000 | Rodder et al. | |
| 6,066,869 A | 5/2000 | Noble et al. | |
| 6,087,208 A | 7/2000 | Krivokapic et al. | |
| 6,093,621 A | 7/2000 | Tseng | |
| 6,114,201 A | 9/2000 | Wu | |
| 6,114,206 A | 9/2000 | Yu | |
| 6,117,697 A | 9/2000 | Seaford et al. | |
| 6,117,741 A | 9/2000 | Chatterjee et al. | |
| 6,120,846 A | 9/2000 | Hintermaier et al. | |
| 6,133,593 A | 10/2000 | Boos et al. | |
| 6,144,072 A | 11/2000 | Iwamatsu et al. | |
| 6,150,222 A | 11/2000 | Gardner et al. | |
| 6,153,485 A | 11/2000 | Pey et al. | |
| 6,163,053 A | 12/2000 | Kawashima | |
| 6,165,880 A | 12/2000 | Yaung et al. | |
| 6,174,820 B1 | 1/2001 | Habermehl et al. | |
| 6,190,975 B1 | 2/2001 | Kubo et al. | |
| 6,200,865 B1 | 3/2001 | Gardner et al. | |
| 6,218,309 B1 | 4/2001 | Miller et al. | |
| 6,251,729 B1 | 6/2001 | Montree et al. | |
| 6,251,763 B1 | 6/2001 | Inumiya et al. | |
| 6,252,262 B1 * | 6/2001 | Jonker et al. | 257/192 |
| 6,252,284 B1 | 6/2001 | Muller et al. | |
| 6,259,135 B1 | 7/2001 | Hsu et al. | |
| 6,261,921 B1 | 7/2001 | Yen et al. | |
| 6,262,456 B1 | 7/2001 | Yu et al. | |
| 6,274,503 B1 | 8/2001 | Hsieh | |
| 6,287,924 B1 | 9/2001 | Chao et al. | |
| 6,294,416 B1 | 9/2001 | Wu | |
| 6,307,235 B1 | 10/2001 | Forbes et al. | |
| 6,310,367 B1 | 10/2001 | Yagishita et al. | |
| 6,319,807 B1 | 11/2001 | Yeh et al. | |
| 6,320,212 B1 | 11/2001 | Chow | |
| 6,335,251 B2 | 1/2002 | Miyano et al. | |
| 6,358,800 B1 | 3/2002 | Tseng | |
| 6,359,311 B1 | 3/2002 | Colinge et al. | |
| 6,362,111 B1 | 3/2002 | Laaksonen et al. | |
| 6,368,923 B1 | 4/2002 | Huang | |
| 6,376,317 B1 | 4/2002 | Forbes et al. | |
| 6,383,882 B1 | 5/2002 | Lee et al. | |
| 6,387,820 B1 | 5/2002 | Sanderfer | |
| 6,391,782 B1 | 5/2002 | Yu | |
| 6,396,108 B1 | 5/2002 | Krivokapic et al. | |
| 6,399,970 B2 | 6/2002 | Kubo et al. | |
| 6,403,434 B1 | 6/2002 | Yu | |
| 6,403,981 B1 | 6/2002 | Yu | |
| 6,406,795 B1 | 6/2002 | Hwang et al. | |
| 6,407,442 B2 | 6/2002 | Inoue et al. | |
| 6,413,802 B1 | 7/2002 | Hu et al. | |
| 6,413,877 B1 | 7/2002 | Annapragada | |
| 6,424,015 B1 | 7/2002 | Ishibashi et al. | |
| 6,437,550 B2 | 8/2002 | Andoh et al. | |
| 6,458,662 B1 | 10/2002 | Yu | |
| 6,459,123 B1 | 10/2002 | Enders et al. | |
| 6,465,290 B1 | 10/2002 | Suguro et al. | |
| 6,472,258 B1 | 10/2002 | Adkisson et al. | |
| 6,475,869 B1 | 11/2002 | Yu | |
| 6,475,890 B1 | 11/2002 | Yu | |
| 6,479,866 B1 | 11/2002 | Xiang | |
| 6,483,146 B2 | 11/2002 | Lee et al. | |
| 6,483,151 B2 | 11/2002 | Wakabayashi et al. | |
| 6,483,156 B1 | 11/2002 | Adkisson et al. | |
| 6,495,403 B1 | 12/2002 | Skotnicki | |
| 6,498,096 B2 | 12/2002 | Bruce et al. | |
| 6,500,767 B2 | 12/2002 | Chiou et al. | |
| 6,501,141 B1 | 12/2002 | Leu | |
| 6,506,692 B2 | 1/2003 | Andideh | |
| 6,525,403 B2 | 2/2003 | Inaba et al. | |
| 6,526,996 B1 | 3/2003 | Chang et al. | |
| 6,534,807 B2 | 3/2003 | Mandelman et al. | |
| 6,537,862 B2 | 3/2003 | Song | |
| 6,537,885 B1 | 3/2003 | Kang et al. | |
| 6,537,901 B2 | 3/2003 | Cha et al. | |
| 6,541,829 B2 | 4/2003 | Nishinohara et al. | |
| 6,555,879 B1 | 4/2003 | Krivokapic et al. | |
| 6,562,665 B1 | 5/2003 | Yu | |
| 6,562,687 B1 | 5/2003 | Deleonibus et al. | |
| 6,566,734 B2 | 5/2003 | Sugihara et al. | |
| 6,583,469 B1 | 6/2003 | Fried et al. | |
| 6,605,498 B1 | 8/2003 | Murthy et al. | |
| 6,607,948 B1 | 8/2003 | Sugiyama et al. | |
| 6,610,576 B2 | 8/2003 | Nowak | |
| 6,611,029 B1 | 8/2003 | Ahmed et al. | |
| 6,630,388 B2 | 10/2003 | Sekigawa et al. | |
| 6,635,909 B2 | 10/2003 | Clark et al. | |
| 6,642,090 B1 | 11/2003 | Fried et al. | |
| 6,642,114 B2 | 11/2003 | Nakamura | |
| 6,645,797 B1 | 11/2003 | Buynoski et al. | |
| 6,645,826 B2 | 11/2003 | Yamazaki et al. | |
| 6,645,861 B2 | 11/2003 | Cabral et al. | |
| 6,656,853 B2 | 12/2003 | Ito | |
| 6,657,259 B2 | 12/2003 | Fried et al. | |
| 6,660,598 B2 | 12/2003 | Hanafi et al. | |

| | | | | | |
|---|---|---|---|---|---|
| 6,664,160 B2 | 12/2003 | Park et al. | 7,045,441 B2 | 5/2006 | Chang et al. |
| 6,680,240 B1 | 1/2004 | Maszara | 7,056,794 B2 | 6/2006 | Ku et al. |
| 6,686,231 B1 | 2/2004 | Ahmed et al. | 7,060,539 B2 | 6/2006 | Chidambarrao et al. |
| 6,689,650 B2 | 2/2004 | Gambino et al. | 7,061,055 B2 | 6/2006 | Sekigawa et al. |
| 6,693,324 B2 | 2/2004 | Maegawa et al. | 7,071,064 B2 | 7/2006 | Doyle et al. |
| 6,696,366 B1 | 2/2004 | Morey et al. | 7,074,623 B2 | 7/2006 | Lochtefeld et al. |
| 6,706,571 B1 | 3/2004 | Yu et al. | 7,084,018 B1 | 8/2006 | Ahmed et al. |
| 6,709,982 B1 | 3/2004 | Buynoski et al. | 7,105,390 B2 | 9/2006 | Brask et al. |
| 6,713,396 B2 | 3/2004 | Anthony | 7,105,891 B2 | 9/2006 | Visokay |
| 6,716,684 B1 | 4/2004 | Krivokapic et al. | 7,105,894 B2 | 9/2006 | Yeo et al. |
| 6,716,686 B1 | 4/2004 | Buynoski et al. | 7,105,934 B2 | 9/2006 | Anderson et al. |
| 6,716,690 B1 | 4/2004 | Wang et al. | 7,112,478 B2 | 9/2006 | Grupp et al. |
| 6,730,964 B2 | 5/2004 | Horiuchi | 7,115,945 B2 | 10/2006 | Lee et al. |
| 6,744,103 B2 | 6/2004 | Snyder | 7,119,402 B2 | 10/2006 | Kinoshita et al. |
| 6,756,657 B1 | 6/2004 | Zhang et al. | 7,122,463 B2 | 10/2006 | Ohuchi |
| 6,762,469 B2 | 7/2004 | Mocuta et al. | 7,141,856 B2 | 11/2006 | Lee et al. |
| 6,764,884 B1 | 7/2004 | Yu et al. | 7,154,118 B2 | 12/2006 | Lindert |
| 6,770,516 B2 | 8/2004 | Wu et al. | 7,163,851 B2 | 1/2007 | Abadeer et al. |
| 6,774,390 B2 | 8/2004 | Sugiyama et al. | 7,163,898 B2 | 1/2007 | Mariani et al. |
| 6,784,071 B2 | 8/2004 | Chen et al. | 7,183,137 B2 | 2/2007 | Lee et al. |
| 6,784,076 B2 | 8/2004 | Gonzalez et al. | 7,187,043 B2 | 3/2007 | Arai et al. |
| 6,787,402 B1 | 9/2004 | Yu | 7,214,991 B2 | 5/2007 | Yeo et al. |
| 6,787,439 B2 | 9/2004 | Ahmed et al. | 7,235,822 B2 | 6/2007 | Li |
| 6,787,845 B2 | 9/2004 | Deleonibus | 7,238,564 B2 | 7/2007 | Ko et al. |
| 6,787,854 B1 | 9/2004 | Yang et al. | 7,241,653 B2 | 7/2007 | Hareland et al. |
| 6,790,733 B1 | 9/2004 | Natzle et al. | 7,247,547 B2 | 7/2007 | Zhu et al. |
| 6,794,313 B1 | 9/2004 | Chang | 7,250,645 B1 | 7/2007 | Wang et al. |
| 6,794,718 B2 | 9/2004 | Nowak et al. | 7,291,886 B2 | 11/2007 | Doris et al. |
| 6,798,000 B2 | 9/2004 | Luyken et al. | 7,339,241 B2 | 3/2008 | Orlowski et al. |
| 6,800,885 B1 | 10/2004 | An et al. | 7,348,284 B2 | 3/2008 | Doyle et al. |
| 6,800,910 B2 | 10/2004 | Lin et al. | 7,348,642 B2 | 3/2008 | Nowak |
| 6,803,631 B2 | 10/2004 | Dakshina-Murthy et al. | 7,354,817 B2 | 4/2008 | Watanabe et al. |
| 6,812,075 B2 | 11/2004 | Fried et al. | 7,358,121 B2 | 4/2008 | Chau et al. |
| 6,812,111 B2 | 11/2004 | Cheong et al. | 7,396,730 B2 | 7/2008 | Li |
| 6,815,277 B2 | 11/2004 | Fried et al. | 7,452,778 B2 | 11/2008 | Chen et al. |
| 6,821,834 B2 | 11/2004 | Ando | 7,456,471 B2 | 11/2008 | Anderson et al. |
| 6,825,506 B2 | 11/2004 | Chau et al. | 7,456,476 B2 | 11/2008 | Hareland et al. |
| 6,830,998 B1 | 12/2004 | Pan et al. | 7,479,421 B2 | 1/2009 | Kavalieros et al. |
| 6,833,588 B2 | 12/2004 | Yu et al. | 7,573,059 B2 | 8/2009 | Hudait et al. |
| 6,835,614 B2 | 12/2004 | Hanafi et al. | 7,585,734 B2 | 9/2009 | Kang et al. |
| 6,835,618 B1 | 12/2004 | Dakshina-Murthy et al. | 7,612,416 B2 | 11/2009 | Takeuchi et al. |
| 6,838,322 B2 | 1/2005 | Pham et al. | 7,655,989 B2 | 2/2010 | Zhu et al. |
| 6,844,238 B2 | 1/2005 | Yeo et al. | 7,701,018 B2 | 4/2010 | Yamagami et al. |
| 6,849,556 B2 | 2/2005 | Takahashi | 2001/0019886 A1 | 9/2001 | Bruce et al. |
| 6,849,884 B2 | 2/2005 | Clark et al. | 2001/0026985 A1 | 10/2001 | Kim et al. |
| 6,852,559 B2 | 2/2005 | Kwak et al. | 2001/0040907 A1 | 11/2001 | Chakrabarti |
| 6,855,606 B2 | 2/2005 | Chen et al. | 2002/0011612 A1 | 1/2002 | Hieda |
| 6,855,990 B2 | 2/2005 | Yeo et al. | 2002/0036290 A1 | 3/2002 | Inaba et al. |
| 6,858,478 B2 | 2/2005 | Chau et al. | 2002/0037619 A1 | 3/2002 | Sugihara et al. |
| 6,864,540 B1 | 3/2005 | Divakaruni et al. | 2002/0048918 A1 | 4/2002 | Grider et al. |
| 6,867,433 B2 | 3/2005 | Yeo et al. | 2002/0058374 A1 | 5/2002 | Kim et al. |
| 6,867,460 B1 | 3/2005 | Anderson et al. | 2002/0074614 A1 | 6/2002 | Furuta et al. |
| 6,869,868 B2 | 3/2005 | Chiu et al. | 2002/0081794 A1 | 6/2002 | Ito |
| 6,869,898 B2 | 3/2005 | Inaki et al. | 2002/0096724 A1 | 7/2002 | Liang et al. |
| 6,870,226 B2 | 3/2005 | Maeda et al. | 2002/0142529 A1 | 10/2002 | Matsuda et al. |
| 6,884,154 B2 | 4/2005 | Mizushima et al. | 2002/0149031 A1 | 10/2002 | Kim et al. |
| 6,885,055 B2 | 4/2005 | Lee | 2002/0160553 A1 | 10/2002 | Yamanaka et al. |
| 6,891,234 B1 | 5/2005 | Connelly et al. | 2002/0166838 A1 | 11/2002 | Nagarajan |
| 6,897,527 B2 | 5/2005 | Dakshina-Murthy et al. | 2002/0167007 A1 | 11/2002 | Yamazaki et al. |
| 6,902,962 B2 | 6/2005 | Yeo et al. | 2002/0177263 A1 | 11/2002 | Hanafi et al. |
| 6,909,151 B2 | 6/2005 | Hareland et al. | 2002/0177282 A1 | 11/2002 | Song |
| 6,919,238 B2 | 7/2005 | Bohr | 2002/0185655 A1 | 12/2002 | Fahimulla et al. |
| 6,921,691 B1 | 7/2005 | Li et al. | 2003/0036290 A1 | 2/2003 | Hsieh et al. |
| 6,921,702 B2 | 7/2005 | Ahn et al. | 2003/0042542 A1 | 3/2003 | Maegawa et al. |
| 6,921,963 B2 | 7/2005 | Krivokapic et al. | 2003/0057477 A1 | 3/2003 | Hergenrother et al. |
| 6,921,982 B2 | 7/2005 | Joshi et al. | 2003/0057486 A1 | 3/2003 | Gambino et al. |
| 6,924,190 B2 | 8/2005 | Dennison | 2003/0067017 A1 | 4/2003 | Ieong et al. |
| 6,955,961 B1 | 10/2005 | Chung | 2003/0080332 A1 | 5/2003 | Phillips |
| 6,960,517 B2 | 11/2005 | Rios et al. | 2003/0085194 A1 | 5/2003 | Hopkins, Jr. |
| 6,967,351 B2 | 11/2005 | Fried et al. | 2003/0098479 A1 | 5/2003 | Murthy et al. |
| 6,974,738 B2 | 12/2005 | Hareland et al. | 2003/0098488 A1 | 5/2003 | O'Keeffe et al. |
| 6,975,014 B1 | 12/2005 | Krivokapic et al. | 2003/0102497 A1 | 6/2003 | Fried et al. |
| 6,977,415 B2 | 12/2005 | Matsuo | 2003/0102518 A1 | 6/2003 | Fried et al. |
| 6,998,301 B1 | 2/2006 | Yu et al. | 2003/0111686 A1 | 6/2003 | Nowak |
| 6,998,318 B2 | 2/2006 | Park | 2003/0122186 A1 | 7/2003 | Sekigawa et al. |
| 7,013,447 B2 | 3/2006 | Mathew et al. | 2003/0143791 A1 | 7/2003 | Cheong et al. |
| 7,018,551 B2 | 3/2006 | Beintner et al. | 2003/0151077 A1 | 8/2003 | Mathew et al. |
| 7,045,401 B2 | 5/2006 | Lee et al. | 2003/0174534 A1 | 9/2003 | Clark et al. |
| 7,045,407 B2 | 5/2006 | Keating et al. | 2003/0190766 A1 | 10/2003 | Gonzalez et al. |

| | | | | | | |
|---|---|---|---|---|---|---|
| 2003/0201458 A1 | 10/2003 | Clark et al. | | 2005/0148137 A1 | 7/2005 | Brask et al. |
| 2003/0203636 A1 | 10/2003 | Anthony | | 2005/0153494 A1 | 7/2005 | Ku et al. |
| 2003/0227036 A1 | 12/2003 | Sugiyama et al. | | 2005/0156171 A1 | 7/2005 | Brask et al. |
| 2004/0016968 A1 | 1/2004 | Coronel et al. | | 2005/0156202 A1 | 7/2005 | Rhee et al. |
| 2004/0029345 A1 | 2/2004 | Deleonibus et al. | | 2005/0156227 A1 | 7/2005 | Jeng |
| 2004/0029393 A1 | 2/2004 | Ying et al. | | 2005/0161739 A1 | 7/2005 | Anderson et al. |
| 2004/0031979 A1 | 2/2004 | Lochtefeld et al. | | 2005/0162928 A1 | 7/2005 | Rosmeulen |
| 2004/0033639 A1 | 2/2004 | Chinn et al. | | 2005/0167766 A1 | 8/2005 | Yagishita |
| 2004/0036118 A1 | 2/2004 | Abadeer et al. | | 2005/0170593 A1 | 8/2005 | Kang et al. |
| 2004/0036126 A1 | 2/2004 | Chau et al. | | 2005/0184316 A1 | 8/2005 | Kim |
| 2004/0036127 A1 | 2/2004 | Chau et al. | | 2005/0189583 A1 | 9/2005 | Kim et al. |
| 2004/0038436 A1 | 2/2004 | Mori et al. | | 2005/0199919 A1 | 9/2005 | Liu |
| 2004/0038533 A1 | 2/2004 | Liang | | 2005/0202604 A1 | 9/2005 | Cheng et al. |
| 2004/0061178 A1 | 4/2004 | Lin et al. | | 2005/0215014 A1 | 9/2005 | Ahn et al. |
| 2004/0063286 A1 | 4/2004 | Kim et al. | | 2005/0215022 A1 | 9/2005 | Adam et al. |
| 2004/0070020 A1 | 4/2004 | Fujiwara et al. | | 2005/0224797 A1 | 10/2005 | Ko et al. |
| 2004/0075149 A1 | 4/2004 | Fitzgerald et al. | | 2005/0224800 A1 | 10/2005 | Lindert et al. |
| 2004/0082125 A1 | 4/2004 | Hou | | 2005/0227498 A1 | 10/2005 | Furukawa |
| 2004/0092062 A1 | 5/2004 | Ahmed et al. | | 2005/0230763 A1 | 10/2005 | Huang et al. |
| 2004/0092067 A1 | 5/2004 | Hanafi et al. | | 2005/0233156 A1 | 10/2005 | Senzaki |
| 2004/0094807 A1 | 5/2004 | Chau et al. | | 2005/0239252 A1 | 10/2005 | Ahn et al. |
| 2004/0099903 A1 | 5/2004 | Yeo et al. | | 2005/0255642 A1 | 11/2005 | Liu et al. |
| 2004/0099966 A1 | 5/2004 | Chau et al. | | 2005/0266645 A1 | 12/2005 | Park |
| 2004/0108523 A1 | 6/2004 | Chen et al. | | 2005/0272192 A1 | 12/2005 | Oh et al. |
| 2004/0108558 A1 | 6/2004 | Kwak et al. | | 2005/0277294 A1 | 12/2005 | Schaeffer et al. |
| 2004/0110097 A1 | 6/2004 | Ahmed et al. | | 2005/0280121 A1 | 12/2005 | Doris et al. |
| 2004/0113181 A1 | 6/2004 | Wicker | | 2005/0287752 A1 | 12/2005 | Nouri et al. |
| 2004/0119100 A1 | 6/2004 | Nowak et al. | | 2006/0014338 A1 | 1/2006 | Doris et al. |
| 2004/0124492 A1 | 7/2004 | Matsuo | | 2006/0040054 A1 | 2/2006 | Pearlstein et al. |
| 2004/0126975 A1 | 7/2004 | Ahmed et al. | | 2006/0043500 A1 | 3/2006 | Chen et al. |
| 2004/0132236 A1 | 7/2004 | Doris et al. | | 2006/0046521 A1 | 3/2006 | Vaartstra et al. |
| 2004/0145000 A1 | 7/2004 | An et al. | | 2006/0063469 A1 | 3/2006 | Talieh et al. |
| 2004/0145019 A1 | 7/2004 | Dakshina-Murthy et al. | | 2006/0068591 A1 | 3/2006 | Radosavljevic et al. |
| 2004/0166642 A1 | 8/2004 | Chen et al. | | 2006/0071299 A1 | 4/2006 | Doyle et al. |
| 2004/0169221 A1 | 9/2004 | Ko et al. | | 2006/0086977 A1 | 4/2006 | Shah et al. |
| 2004/0169269 A1 | 9/2004 | Yeo et al. | | 2006/0148182 A1 | 7/2006 | Datta et al. |
| 2004/0180491 A1 | 9/2004 | Arai et al. | | 2006/0154478 A1 | 7/2006 | Hsu et al. |
| 2004/0191980 A1 | 9/2004 | Rios et al. | | 2006/0170066 A1 | 8/2006 | Mathew et al. |
| 2004/0195624 A1 | 10/2004 | Liu et al. | | 2006/0172480 A1 | 8/2006 | Wang et al. |
| 2004/0198003 A1 | 10/2004 | Yeo et al. | | 2006/0172497 A1 | 8/2006 | Hareland et al. |
| 2004/0203254 A1 | 10/2004 | Conley et al. | | 2006/0180859 A1 | 8/2006 | Radosavljevic et al. |
| 2004/0209463 A1 | 10/2004 | Kim et al. | | 2006/0202270 A1 | 9/2006 | Son et al. |
| 2004/0217420 A1 | 11/2004 | Yeo et al. | | 2006/0204898 A1 | 9/2006 | Gutsche et al. |
| 2004/0219711 A1 | 11/2004 | Wu et al. | | 2006/0205164 A1 | 9/2006 | Ko et al. |
| 2004/0219722 A1 | 11/2004 | Pham et al. | | 2006/0211184 A1 | 9/2006 | Boyd et al. |
| 2004/0219780 A1 | 11/2004 | Ohuchi | | 2006/0220131 A1 | 10/2006 | Kinoshita et al. |
| 2004/0222473 A1 | 11/2004 | Risaki | | 2006/0227595 A1 | 10/2006 | Chuang et al. |
| 2004/0227187 A1 | 11/2004 | Cheng et al. | | 2006/0240622 A1 | 10/2006 | Lee et al. |
| 2004/0238887 A1 | 12/2004 | Nihey | | 2006/0244066 A1 | 11/2006 | Yeo et al. |
| 2004/0238915 A1 | 12/2004 | Chen et al. | | 2006/0263699 A1 | 11/2006 | Abatchev et al. |
| 2004/0256647 A1 | 12/2004 | Lee et al. | | 2006/0281325 A1 | 12/2006 | Chou et al. |
| 2004/0262683 A1 | 12/2004 | Bohr et al. | | 2007/0001219 A1 | 1/2007 | Radosavljevic et al. |
| 2004/0262699 A1 | 12/2004 | Rios et al. | | 2007/0023795 A1 | 2/2007 | Nagano et al. |
| 2005/0019993 A1 | 1/2005 | Lee et al. | | 2007/0029624 A1 | 2/2007 | Nowak |
| 2005/0020020 A1 | 1/2005 | Collaert et al. | | 2007/0045735 A1 | 3/2007 | Orlowski et al. |
| 2005/0035415 A1 | 2/2005 | Yeo et al. | | 2007/0045748 A1 | 3/2007 | Booth et al. |
| 2005/0040429 A1 | 2/2005 | Uppal | | 2007/0048930 A1 | 3/2007 | Figura et al. |
| 2005/0040444 A1 | 2/2005 | Cohen | | 2007/0052041 A1 | 3/2007 | Sorada et al. |
| 2005/0059214 A1 | 3/2005 | Cheng et al. | | 2007/0069302 A1 | 3/2007 | Jin et al. |
| 2005/0062082 A1 | 3/2005 | Bucher et al. | | 2007/0090416 A1 | 4/2007 | Doyle et al. |
| 2005/0073060 A1 | 4/2005 | Datta et al. | | 2007/0093010 A1 | 4/2007 | Mathew et al. |
| 2005/0093028 A1 | 5/2005 | Chambers | | 2007/0108514 A1 | 5/2007 | Inoue et al. |
| 2005/0093067 A1 | 5/2005 | Yeo et al. | | 2007/0187682 A1 | 8/2007 | Takeuchi et al. |
| 2005/0093075 A1 | 5/2005 | Bentum et al. | | 2007/0241414 A1 | 10/2007 | Narihiro |
| 2005/0093154 A1 | 5/2005 | Kottantharayil et al. | | 2007/0262389 A1 | 11/2007 | Chau et al. |
| 2005/0104055 A1 | 5/2005 | Kwak et al. | | 2008/0017890 A1 | 1/2008 | Yuan et al. |
| 2005/0110082 A1 | 5/2005 | Cheng et al. | | 2008/0017934 A1 | 1/2008 | Kim et al. |
| 2005/0116289 A1 | 6/2005 | Boyd et al. | | 2008/0111163 A1 | 5/2008 | Russ et al. |
| 2005/0118790 A1 | 6/2005 | Lee et al. | | 2008/0116515 A1 | 5/2008 | Gossner et al. |
| 2005/0127362 A1 | 6/2005 | Zhang et al. | | 2008/0128797 A1 | 6/2008 | Dyer et al. |
| 2005/0127632 A1 | 6/2005 | Gehret | | 2008/0212392 A1 | 9/2008 | Bauer |
| 2005/0133829 A1 | 6/2005 | Kunii et al. | | 2008/0237655 A1 | 10/2008 | Nakabayashi et al. |
| 2005/0133866 A1 | 6/2005 | Chau et al. | | 2008/0258207 A1 | 10/2008 | Radosavljevic et al. |
| 2005/0136584 A1 | 6/2005 | Boyanov et al. | | 2009/0061572 A1 | 3/2009 | Hareland et al. |
| 2005/0139860 A1 | 6/2005 | Snyder et al. | | 2009/0099181 A1 | 4/2009 | Wurster et al. |
| 2005/0145894 A1 | 7/2005 | Chau et al. | | 2010/0200923 A1 | 8/2010 | Chen et al. |
| 2005/0145941 A1 | 7/2005 | Bedell et al. | | | | |
| 2005/0145944 A1 | 7/2005 | Murthy et al. | | | | |
| 2005/0148131 A1 | 7/2005 | Brask | | | | |

FOREIGN PATENT DOCUMENTS

| | | |
|---|---|---|
| EP | 0265314 | 4/1988 |
| EP | 0469604 | 2/1992 |
| EP | 0474952 | 3/1992 |
| EP | 0510667 | 10/1992 |
| EP | 0623963 | 5/1994 |
| EP | 1091413 | 4/2001 |
| EP | 1202335 | 5/2002 |
| EP | 1566844 | 8/2005 |
| GB | 2156149 | 10/1985 |
| JP | 56073454 | 6/1981 |
| JP | 59145538 | 8/1984 |
| JP | 2303048 | 12/1990 |
| JP | 05090252 | 4/1993 |
| JP | 06005856 | 1/1994 |
| JP | 06132521 | 5/1994 |
| JP | 6151387 | 5/1994 |
| JP | 406177089 A | 6/1994 |
| JP | 9162301 | 6/1997 |
| JP | 2000037842 | 2/2000 |
| JP | 2001-189453 | 7/2001 |
| JP | 2001338987 | 12/2001 |
| JP | 2002298051 | 10/2002 |
| JP | 2005085916 | 3/2005 |
| TW | 200414538 | 8/1992 |
| TW | 200518310 | 11/1992 |
| TW | 516232 | 1/2003 |
| TW | 561530 | 1/2003 |
| TW | 548799 | 8/2003 |
| TW | 200402872 | 2/2004 |
| TW | 200405408 | 4/2004 |
| TW | 200417034 | 9/2004 |
| WO | WO-9106976 | 5/1991 |
| WO | WO-0243151 | 5/2002 |
| WO | WO-02095814 | 11/2002 |
| WO | WO-03003442 | 1/2003 |
| WO | WO-2004059726 | 7/2004 |
| WO | WO-2005036651 | 4/2005 |

OTHER PUBLICATIONS

Bessolov and Lebedev., "Chacogenide passivation of III-V semiconductor surfaces", Semiconductors, 32, 1998, pp. 1141-1156.*
Gonzalez et al., "Selenium passivation of GaAs (001): a combined experimental and theoretical study", J.Phys.Condens.Matter 16, 2004, pp. 2187-2206.*
Passlack et al. "Self-Aligned GaAs p-Channel Enhancement Mode MOS Heterostructure Field-Effect Transistor," IEEE Electron Device Letters, 23, 2002, pp. 508-510.*
Ashley et al. "High Speed, Low-Power InSb Transistors," IEEE, 1997, pp. 30.4.1-30.4.4.*
Kuruvilla et al., "Passivation of GaAs (100) using selenium sulfide," J. Appl.Phys. 73, 1993, pp. 4384-4387.*
International Preliminary Report on Patentability from PCT/US2006/044601 mailed Jun. 12, 2008, 11 pgs.
Office Action from U.S. Appl. No. 11/292,399 mailed Apr. 21, 2008, 21 pgs.
International Search Report and Written Opinion from PCT/US2006/044601 mailed Mar. 19, 2007, 17 pgs.
Examination Report from EP 06837855.3-1235 mailed Oct. 24, 2008, 13 pgs.
Ashley, et al., "Novel InSb-based Quantum Well Transistors for High Speed, Low Power Applications", QinetiQ, Malvern Technology Center and Intel (2004), 4 pgs.
Bednyi, et al., "Electronic State of the Surface of INP Modified by Treatment in Sulfur Vapor", Soviet Physics Semiconductors, Am. Inst. of Physics, New York, vol. 26, No. 8, Aug. 1, 1992, 2 pgs.
Datta, et al., "85nm Gate Length Enhancement and Depletion Mode InSb Quantum Well Transistors for Ultra High Speed and Very Low Power Digital Logic Applications", IEEE Dec. 5, 2005, 4 pgs.
Jang, H.W., et al., "Incorporation of Oxygen Donors in AlGaN", J. Electrochem Soc 152, 2004, 5 pgs.
Park, K.Y., et al., "Device Characteristics of AlGaN/GaN MIS-HFET Using A/203-HfO3 Laminated High-k Dielectric", Japan Journ of Appl.Phys. vol. 43, 2004, 3 pgs.

Ashley, et al., "Novel InSb-based Quantum Well Transistors for Ultra-High Speed, Low Power Logic Applications", IEEE 2004, pp. 2253-2256.
Frank, et al., "HfO2 and Al2O3 Gate Dielectrics on GaAs Grown by Atomic Layer Deposition", Applied Physics Letters, vol. 86, Issue 15, id 152904, 2005, 1 pg.
Office Action from Taiwanese Patent Application No. 095143047, mailed Mar. 18, 2010, 7 pgs.
First Office Action from Chinese Applications No. 200680044311, mailed Nov. 25, 2009, 15 pgs.
Second Office Action from Chinese Patent Application No. 200680044431.1, mailed Apr. 30, 2010, 3 pgs.
International Search Report from PCT/US 03/26242 mailed on Jan. 26, 2004, 8 Pages.
International Search Report from PCT/US 03/39727 mailed on Apr. 27, 2004, 6 Pages.
International Search Report and Written Opinion from PCT/US2005/010505 mailed Aug. 26, 2005, 24 Pages.
Invitation to Pay Additional Fees from PCT/US2004/032442 mailed on Apr. 12, 2005, 5 Pages.
International Search Report & Written Opinion from PCT/US2006/000378 mailed on May 24, 2006, 11 Pages.
International Search Report & Written Opinion from PCT/US2005/000947 mailed on May 3, 2005, 14 Pages.
International Search Report and Written Opinion from PCT/US2005/020339 mailed on Oct. 4, 2005, 12 Pages.
International Search Report from PCT/US2003/26242 mailed Jan. 26, 2004, 8 Pages.
International Search Report from PCT/US 03/40320 mailed Jun. 2, 2004, 6 Pages.
Office Action from U.S. Appl. No. 10/227,068 mailed Dec. 18, 2006, 25 Pages.
Office Action from U.S. Appl. No. 10/703,316 mailed Dec. 15, 2006, 22 Pages.
International Search Report & Written Opinion from PCT/US2006/025751 mailed on Dec. 6, 2006, 14 Pages.
International Search Report & Written Opinion from PCT/US2005/035380 mailed on Feb. 13, 2006, 14 Pages.
International Search Report & Written Opinion from PCT/US2005/033439 mailed on Jan. 31, 2006, 7 Pages.
International Search Report & Written Opinion from PCT/US2005/037169 mailed on Feb. 23, 2006, 11 Pages.
International Preliminary Report on Patentability from PCT/US2005/010505 mailed on Oct. 12, 2006, 16 Pages.
International Search Report & Written Opinion from PCT/US2004/032442 mailed on Jun. 16, 2005, 12 Pages.
Office Action from U.S. Appl. 11/234,014 mailed Jan. 23, 2008, 9 Pages.
International Search Report & Written Opinion from PCT/US2006/037634 mailed on May 31, 2007, 21 Pages.
International Search Report & Written Opinion from PCT/US2006/037643 mailed on Jan. 24, 2007, 14 Pages.
Final Office Action from U.S. Appl. No. 11/158,661 mailed Jan. 15, 2008, 25 Pages.
Office Action from U.S. Appl. No. 11/080,765 mailed May 2, 2007, 47 Pages.
Final Office Action from U.S. Appl. No. 11/080,765 mailed Nov. 13, 2007, 13 Pages.
Office Action from PRC Application No. 200580007279.5, PCT/US05/ 000947, mailed Apr. 4, 2008, 2 Pages.
Written Opinion from Singapore Patent Application No. 200604766-6 mailed Apr. 4, 2008, 4 Pages.
Office Action from Taiwan Patent Application No. 95122087 mailed Jun. 20, 2008, 8 Pages.
IPO Search Report for Taiwan Patent Application No. 094136197, date mailed Sep. 19, 2008, 1 Page.
Office Action from European Patent Application No. 03817699.6 mailed Aug. 29, 2007, 3 Pages.
Written Opinion from Patent Application No. 2005070131 mailed Mar. 18, 2007, 4 Pages.

International Preliminary Report on Patentability from Application No. PCT/US2006/024516 mailed Jan. 10, 2008, 11 Pages.
Office Action from Taiwan Patent Application No. 95123858, dated Oct. 9, 2008, 10 Pages.
Office Action from U.S. Appl. No. 12/025,665 mailed on Nov. 12, 2008, 21 Pages.
International Search Report PCT/US2003/40320 mailed Jun. 2, 2004, 6 Pages.
Office Action from U.S. Appl. No. 11/855,823, mailed Dec. 30, 2008, 18 Pages.
Office Action from Taiwan Patent Application No. 95135820 mailed on Jan. 9, 2009, 14 Pages.
Office Action from Taiwan Patent Application No. 95123858—translation, mailed Mar. 3, 2009, 10 Pages.
Office Action from U.S. Appl. No. 11/240,487 mailed Mar. 17, 2009, 13 Pages.
Office Action from U.S. Appl. No. 11/322,795 mailed Mar. 4, 2009, 12 Pages.
Office Action from Taiwan Patent Application No. 95122087 mailed Dec. 16, 2008, 14 Pages.
German Office Action for German Patent Application No. 11 2006 003 576.2-33 mailed Dec. 12, 2008, 3 Pages.
Office Action from U.S. Appl. No. 11/154,138 mailed Jun. 23, 2009, 14 Pages.
Office Action from Taiwan Patent Application No. 95135820 mailed Jun. 4, 2009, 18 Pages.
Second Office Action from Chinese Patent Application No. 200580032314.9 mailed May 8, 2009, 14 Pages.
Final Office Action from U.S. Appl. No. 12/025,665 mailed Jun. 10, 2009, 10 Pages.
Non-Final Office Action for U.S. Appl. No. 11/855,823, Mailed Jul. 23, 2009, 31 Pages.
Non-Final Office Action from U.S. Appl. No. 11/322,795 Mailed Jul. 28, 2009, 18 Pages.
Office Action from Chinese Patent Application No. 200680023301.X mailed Jun. 26, 2009, 21 Pages.
Final Office Action from U.S. Appl. No. 11/240,487 mailed Sep. 21, 2009, 22 Pages.
Non-Final Office Action for U.S. Appl. No. 12/259,464, Mailed Oct. 20, 2009, 41 Pages.
Notice of Preliminary Rejection mailed Sep. 14, 2009 for Korean Application No. 10-2007-7030988 incl. translation, 4 Pages.
Final Office Action for U.S. Appl. No. 11/322,795 Mailed Jan. 13, 2010, 12 Pages.
Notice of Allowance and Fees for U.S. Appl. No. 11/855,823 Mailed Sep. 2, 2010, 33 Pages.
Office Action for U.S. Appl. No. 12/333,248 mailed Nov. 30, 2009, 24 Pages.
Notice of Allowance for U.S. Appl. No. 11/154,138 mailed Aug. 13, 2010, 10 Pages.
Office Action for German Patent Application No. 112006001735.7 mailed Oct. 20, 2009, 6 Pages.
Office Action for Chinese Patent Application No. 200680021817.0 mailed Jun. 12, 2009, 11 Pages.
Office Action for European Patent Application No. 05711376.3 mailed Jan. 11, 2010, 5 Pages.
Office Action for U.S. Appl. No. 11/332,189 mailed Jul. 8, 2010, 12 Pages.
Office Action for Chinese Patent Application No. 200580009823.X mailed Jun. 21, 2010, 5 Pages.
Office Action for United Kingdom Patent Application No. 0724762.0 mailed Jul. 15, 2010, 10 Pages.
Office Action for Korean Patent Application No. 10-2007-7030988 mailed Aug. 10, 2010, 5 Pages.
Office Action from U.S. Appl. No. 11/238,445 mailed Oct. 20, 2006, 22 Pages.
Final Office Action from U.S. Appl. No. 11/238,445 mailed May 14, 2007, 16 Pages.
Office Action from U.S. Appl. No. 11/649,545 mailed Sep. 23, 2009, 25 Pages.
Office Action from U.S. Appl. No. 11/649,545 mailed Aug. 17, 2010, 7 Pages.
Office Action from U.S. Appl. No. 11/501,253 mailed May 14, 2008, 12 Pages.
Office Action from U.S. Appl. No. 11/501,253 mailed Dec. 12, 2008, 8 Pages.
Notice of Allowance from U.S. Appl. No. 11/501,253 mailed Apr. 7, 2009, 5 Pages.
Office Action from U.S. Appl. No. 11/305,452 mailed Apr. 18, 2008, 7 Pages.
Office Action from U.S. Appl. No. 11/305,452 mailed Feb. 9, 2009, 8 Pages.
Final Office Action from U.S. Appl. No. 11/305,452 mailed Nov. 13, 2009, 8 Pages.
Office Action from U.S. Appl. No. 11/305,452 mailed Aug. 4, 2010, 7 Pages.
Final Office Action from U.S. Appl. No. 11/305,452 mailed Jan. 21, 2011, 15 Pages.
Office Action from U.S. Appl. No. 11/498,901 mailed Aug. 1, 2008, 13 Pages.
Final Office Action from U.S. Appl. No. 11/498,901 mailed Nov. 17, 2008, 17 Pages.
Office Action from U.S. Appl. No. 11/498,901 mailed Jun. 8, 2009, 9 Pages.
Final Office Action from U.S. Appl. No. 11/498,901 mailed Dec. 17, 2009, 10 Pages.
Office Action from U.S. Appl. No. 11/498,901 mailed Mar. 26, 2010, 14 Pages.
Final Office Action from U.S. Appl. No. 11/498,901 mailed Sep. 1, 2010, 16 Pages.
Office Action from U.S. Appl. No. 11/238,447 mailed Apr. 6, 2007, 19 Pages.
Office Action from U.S. Appl. No. 11/238,447 mailed Sep. 27, 2007, 9 Pages.
Office Action for European Application No. 05711376.3 mailed Jan. 11, 2010, 5 Pages.
Office Action from Taiwan Patent Application No. 95135820 mailed Oct. 22, 2009, 5 Pages.
Non-final Office Action for U.S. Appl. No. 11/855,823 mailed Mar. 15, 2010 31 Pages.
Non-Final Office Action for Korean Patent Application No. 10-2007-7030988 Mailed Mar. 12, 2010, 3 Pages.
Non-Final Office Action for European Application No. 03817697.0 Mailed Mar. 9, 2010, 5 Pages.
Non-Final Office Action for U.S. Appl. No. 11/335,103 mailed Nov. 13, 2009, 17 Pages.
Final Office Action for U.S. Appl. No. 11/154,138 mailed Dec. 8, 2009, 13 Pages.
Non-Final Office Action for U.S. Appl. No. 11/240,487 mailed Dec. 11, 2009, 11 Pages.
Second Office Action for Chinese Application No. 200680021817.0 mailed Dec. 11, 2009, 11 Pages.
Non-Final Office Action for U.S. Appl. No. 12/114,227 mailed Mar. 30, 2010, 30 Pages.
Non-Final Office Action for U.S. Appl. No. 11/240,440 mailed May 15, 2010, 8 Pages.
Final Office Action for U.S. Appl. No. 11/335,103 mailed May 26, 2010, 14 Pages.
Non-Final Office Action for U.S. Appl. No. 12/369,642 mailed Apr. 27, 2010, 15 Pages.
Third Office Action for Chinese Application No. 200580032314.9 mailed Jan. 29, 2010, 21 Pages.
Office Action from Japanese Application No. 2006-549560 mailed Apr. 13, 2010, 8 Pages.
Non-Final Office Action for U.S. Appl. No. 10/973,228 mailed Feb. 2, 2010, 22 Pages.
Auth, Christopher P. et al., Vertical, Fully-Depleted, Surrounding Gate MOSFETs on sub-0.1 um Thick Silicon Pillars, 54th Annual Device Research Conference Digest, 1996, 2 Pages.
Balakrishnan, G. et al., "Room-Temperature Optically-Pumped InGaSb Quantum Well Lasers Monolithically Grown on Si (100) Substrate", IEE 2005, 2 Pages, Mailed Feb. 12, 2005.
Buchanan, D. A. et al., Fabrication of Midgap Metal Gates Compatible With Ultrathin Dielectrics, Applied Physics Letters, vol. 73.12, Sep. 21, 1998, 3 Pages.

Burenkov, A. et al., Corner Effect in Double and Triple Gate FinFETs, European Solid-State Device Research 2003, 33rd Conference on ESSDERC, 4 Pages.

Chang, L. et al., CMOS Circuit Performance Enhancement by Surface Orientation Optimization, IEEE Transactions on Electron Devices, vol. 51, No. 10, Oct. 2004, 7 Pages.

Chang, S. T. et al., 3-D Simulation of Strained Si/SiGe Heterojunction FinFets, Semiconductor Device Research Symposium, Dec. 2003, 2 Pages.

Chau, Robert, Advanced Metal Gate/High-K Dielectric Stacks for High-Performance CMOS Transistors, Components Research, Intel Corporation, 2004, 3 Pages.

Final Office Action for U.S. Appl. No. 11/828,290, mailed Feb. 17, 2010, 18 Pages.

Choi, Yang-Kyu et al., A Spacer Patterning Technology for Nanoscale CMOS, IEEE, (49)3, XP-001102694, Mar. 2002, 6 Pages.

Choi, Yang-Kyu et al., Sub-20nm CMOS FinFET Technologies, IEEE, IEDM, 2001, 4 Pages.

Claflin, B. et al., Interface Studies of Tungsten Nitride and Titanium Nitride Composite Metal Gate Electrodes With Thin Dielectric Layers, Journal of Vacuum Science and Technology A 16.3, May/Jun. 1998, 5 Pages.

Collaert, N, et al., A Functional 41-stage ring oscillator using scaled FinFET devices with 25-nm gate lengths and 10-nm fin widths applicable for the 45-nm CMOS node, IEEE Electron Device Letters, vol. 25, No. 8, Aug. 2004, 3 Pages.

Fried, David M. et al., Improved Independent Gate N-Type FinFET Fabrication and Characterization, IEEE 24(9), Sep. 2003, 3 Pages.

Fried, David M. et al., High-Performance P-Type Independent-Gate FinFETs, IEEE 25(4), 2004, 3 Pages.

Guo, Jing et al., Performance Projections for Ballistic Carbon Nanotube Field-Effect Transistors, Applied Physics Letters 80(17), Apr. 29, 2002, 3 Pages.

Hisamoto, Digh et al., A Fully Depleted Lean-Channel Transistor (DELTA)-A Novel Vertical Ultrathin SOI MOSFET, IEEE Electron Device Letters, V. 11 (1), Jan. 1990, 4 Pages.

Hisamoto, Digh et al., A Folded-Channel MOSFET for Deepsub-tenth Micron Era, 1998 IEEE International Electron Device Meeting Technical Digest, 3 Pages.

Hisamoto, Digh et al., FinFET-A Self-Aligned Double-Gate MOSFET Scalable to 20 nm, IEEE Transactions on Electron Devices, vol, 47, No. 12, Dec. 2000, 6 Pages.

Huang, Xuejue et al., "Sub 50 nm FinFET: PMOS", 1999 IEEE International Electron Device Meeting Technical Digest, 1999, 4 Pages.

Hwang, Jeong-Mo et al,. Novel Polysilicon/Tin Stacked-Gate Structure for Fully-Depleted SOI/CMOS, International Electronic Devices Meeting Technical Digest, 1992, 4 Pages.

Ieong, M. et al., Three Dimensional CMOS Devices and Integrated Circuits, IEEE CICC, San Jose, CA Sep. 21-24, 2003, 8 Pages.

Javey, Ali et al., High-k dielectrics for advanced carbon-nanotube transistors and logic gates, www.nature.com/naturematerials.com, 2002, 6 Pages.

Javey, Ali et al., Ballistic carbon nanotube field-effect transistors, Nature, vol. 424, Aug. 7, 2003, 4 Pages.

Jin, B., Mobility Enhancement in Compressively Strained Sige Surface Channel PMOS Transistors with HFO2/TIN Gate Stack, Components Research, Intel Corporation, Oct. 2004, 12 Pages.

Jones, E. C. et al., Doping Challenges in Exploratory Devices for High Performance Logic, 14th Int'l Conference, Piscataway, NJ, Sep. 22-27, 2002, 6 Pages.

Kim, Sung M. et al., A Novel Multi-channel Field Effect Transistor (McFET) on Bulk Si for High Performance Sub-80nm Application, IEEE, 2004, 4 Pages.

Kuo, Charles et al., A Capacitorless Double-Gate DRAM Cell Design for High Density Applications, IEEE, 2002, 4 Pages.

Kuo, Charles et al,, "A Capacitorless Double Gate DRAM Technology for Sub-100-nm Embedded and Stand-Alone Memory Applications", IEEE 50(12), (2003), 9 Pages.

Ludwig et al., FinFET Technology for Future Microprocessors, IEEE Int'l. SOI Conference, New Port Beach, CA, Sep. 29-Oct. 2, 2003, 2 Pages.

Martel, Richard et al., "Carbon Nanotube Field Effect Transistors for Logic Applications", IEEE 2001, 4 Pages.

Mayer, T. M. et al., "Chemical Vapor Deposition of Flouroalkylsilane Monolayer Films for Adhesion Control in Microelectromechanicai Systems", J. Vac. Sci. Technol. B. 18(5), 2000, 8 Pages.

Mori, M. et al., "Heteroepitaxial Growth of InSb on a Si (0 0 1) Substrate Via AISb Buffer Layer", Applied Surface Science 216, 2003, 6 Pages.

Nackaerts et al,, "A 0.314um2 6T-SRAM Cell build with Tall Triple-Gate Devices for 45nm node applications using 0.75NA 193nm lithography", IEEE, 2004, 4 Pages.

Nowak, E. J. at al., "A Functional FinFET-DGCMOS SRAM Cell", Int'l. Electron Devices Meeting, San Francisco, CA Dec. 8-11, 2002, 4 Pages.

Nowak, E. J. et al., "Scaling Beyond the 65 nm Node with FinFET-DGCMOSs", IEEE CICC, San Jose, CA Sep. 21-24, 2003, 4 Pages.

Nowak, Edward J. et al., "Turning Silicon on Its Edge", IEEE Circuits & Devices Magazine vol. 1, Jan./Feb. 2004, 12 Pages.

Ohsawa, Takashi at al., "Memory Design Using a One-Transistor Gain Cell on SOI", IEEE 37(11), Nov. 2002, 13 Pages.

Park, Jae-Hyoun et al., Quantum-Wired MOSFET Photodetector Fabricated by Conventional Photolighography on SOI Substrate, Nanotechnology, 4th IEEE Conference on Munich, Germany, Aug. 16-19, 2004, Piscataway, NJ, 3 Pages.

Park, Donggun et al., 3-dimensional nano-CMOS Transistors to Overcome Scaling Limits, IEEE 2004, ISBN 0-7803-8511-X, 6 Pages.

Park, T. et al., "Fabrication of Body-Tied FinFETs (Omega MOSFETS) Using Bulk Si Wafers", 2003 Symposia on VLSI Technology Digest of Technical Papers, Jun. 2003, 2 Pages.

Park, Jong-Tae at al., "Pi-Gate SOI MOSFET", IEEE Electron Device Letters, vol. 22, No. 8, Aug. 2001, 2 Pages.

Park, T. et al., "PMOS Body-Tied FinFET (Omega MOSFET) Characteristics", IEEE Device Research Conference, Piscataway, NJ, Jun. 23-25, 2003, 2 Pages.

Scholz, S. et al., "MOVPE growth of GaAs on Ge substrates by inserting a thin low temperature buffer layer", Cryst. Res, Technol. 41, No. 2, Jan. 15, 2006, 6 Pages.

Seevinck, Evert et al., Static-Noise Margin Analysis of MOS SRAM Cells, IEEE, Journal of Solid-State Circuits, (SC-22)5, Oct. 1987, 7 Pages.

Sieg, R. M. et al,, "Toward device-quality GaAs growth by molecular beam epitaxy on offcut Ge/Si_Ge/Si substrates", J. Vac. Sci. Technol. B, vol. 16, No. 3, May/Jun. 1998. 4 Pages.

Stadele, M. et al., A Comprehensive Study of Corner Effects in Tri-gate Transistors, IEEE 2004, 4 Pages.

Stolk, Peter A. et al., Device Modeling Statistical Dopant Fluctuations in MOS Transistors, IEEE Transactions on Electron Devices, (45)9, 1997, 4 Pages.

Subramanian, V., "A Bulk-Si-Compatible Ultrathin-body SOI Technology for Sub-100m MOSFETS", Proceeding of the 57th Annual Device Research Conference, (1999), 2 Pages.

Sugizaki, T. et al., Novel Multi-bit SONOS Type Flash Memory Using a High-k Charge Trapping Layer, VLSI Technology, 2003. Digest of Technical Papers. Symposium on Jun. 10-12, 2003, 2 Pages.

Tanaka, T. et al., Scalability Study on a Capacitorless IT-DRAM: From Single-gate PD-SOI to Double-gate FinDRAM, IEEE, 2004, 4 Pages.

Tang, Stephen H. et al., FinFET—A Quasi-Planar Double-Gate MOSFET, IEEE International Solid-State Circuits Conference, Feb. 6, 2001, 3 Pages.

Tokoro, Kenji et al., Anisotropic Etching Properties of Silicon in KOH and TMAH Solutions, International Symposium on Micromechatronics and Human Science, IEEE, 1998, 6 Pages.

Wan, A. et al., "Characterization of GaAs grown by molecular beam epitaxy on vicinal Ge (100) substrates", J. Vac. Sci. Technol, B, vol. 22, No. 4, Jul. 27, 2004, 6 Pages.

Wang, X. et al., "Band alignments in sidewall strained Si/strained SiGe heterostructures", May 28, 2002, 5 Pages.

Wolf, Stanley et al., Silicon Processing for the VLSI Era, vol. 1: Process Technology, Lattice Press, Sep. 1986, 3 Pages.

Xiong, W, et al., Corner Effect in Multiple-Gate SOI MOSFETs, IEEE, 2003, 3 Pages.

Xiong, Weize et al., Improvement of FinFET Electrical Characteristics by Hydrogen Annealing, IEEE Electron Device Letters, 25(8), Aug. 2004, 3 Pages.

Yang, Fu-Liang et al., 5nm-Gate Nanowire FinFET, IEEE, 2004, 2 Pages.

Bandyopadhyay, Krisanu et al., "Self-Assembled Monolayers of Small Aromatic Disulfide and Diselenide Molecules on Polycrystalline Gold Films:", Department of Chemistry & Regional Sophisticated Instrumentation Centre, India Institute of Technology, Apr. 30, 1999, 10 Pages.

Search Report and Written Opinion for European Patent Application No. 10184650.9 mailed Jan. 31, 2011, 18 Pages.

* cited by examiner

DIELECTRIC INTERFACE FOR GROUP III-V SEMICONDUCTOR DEVICE

CROSS-REFERENCE TO RELATED APPLICATIONS

This application is a divisional of U.S. patent application Ser. No. 11/292,399, filed Nov. 30, 2005 now U.S. Pat. No. 7,485,503, entitled "DIELECTRIC INTERFACE FOR GROUP III-V SEMICONDUCTOR DEVICE," the entire contents of which are hereby incorporated by reference herein.

FIELD OF THE INVENTION

The invention relates to the field of Group III-V semiconductor devices.

PRIOR ART AND RELATED ART

Most integrated circuits today are based on silicon, a Group IV element of the periodic table. Compounds of Group III-V elements such as gallium arsenide (GaAs), indium antimonide (InSb), and indium phosphide (InP) are known to have far superior semiconductor properties than silicon, including higher electron mobility and saturation velocity. Unlike the Group III-V compounds, silicon easily oxidizes to form an almost perfect electrical interface. This gift of nature makes possible the near total confinement of charge with a few atomic layers of silicon dioxide. In contrast, oxides of Group III-V compounds are of poor quality, for instance they contain defects, trap charges, and are chemically complex.

Quantum well field-effect transistors (QWFET) have been proposed based on a Schottky metal gate and an InSb well. They show promise in lowering active power dissipation compared to silicon-based technology, as well as improved high frequency performance. Unfortunately, the off-state gate leakage current is high because of the low Schottky barrier from Fermi level pinning of the gate metal on, for example, an InSb/AlInSb surface.

The use of a high-k gate insulator has been proposed for QWFETs. See, as an example, Ser. No. 11/208,378, filed Jan. 3, 2005, entitled "QUANTUM WELL TRANSISTOR USING HIGH DIELECTRIC CONSTANT DIELECTRIC LAYER." However, there are problems in interfacing between a high-k material and, for instance, the InSb/AlInSb surface.

DETAILED DESCRIPTION

Processes and devices are described in connection with interfacing a high k dielectric with a Group III-V confinement region in a semiconductor device. In the following description, numerous specific chemistries are described, as well as other details, in order to provide a thorough understanding of the present invention. It will be apparent to one skilled in the art, that the present invention may be practiced without these specific details. In other instances, well-known processing steps are not described in detail in order not to unnecessarily obscure the present invention.

Figure 1:
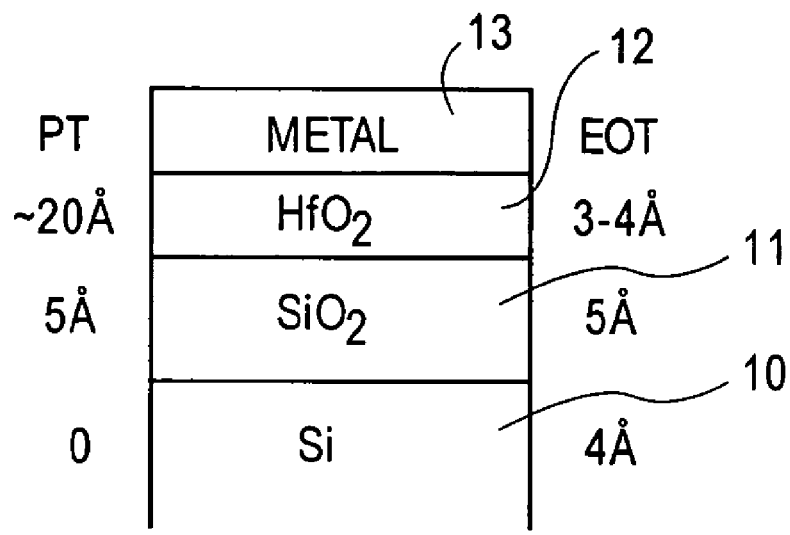
FIG. 1 illustrates a prior art high k dielectric interface between a silicon substrate and a metal gate.

FIG. 1 illustrates an interface between a metal gate 13 and a monocrystalline silicon body or substrate 10. Most typically, the silicon 10 comprises the channel region of a field-effect transistor with a gate 13 for controlling the transistor. Such devices perform particularly well when the equivalent oxide thickness (EOT) of the insulation between the channel region and gate is in the range of 5-30 Å and preferably in the range of 10-15 Å. While silicon dioxide ($SiO_2$) provides an excellent dielectric, with layers this thin, it is difficult to obtain a reliable silicon dioxide dielectric. Rather, high k materials (e.g. dielectric constant of 10 or greater) are used. As shown in FIG. 1, a silicon dioxide region 11 is first formed (or is native) on the silicon 10. Then, a high k dielectric 12 such as hafnium dioxide ($HfO_2$) is formed on the silicon dioxide region 11. Next, a metal gate, typically with a targeted work function, is formed on the high k dielectric. The high k dielectric such as $HfO_2$ or zirconium dioxide ($ZrO_2$) provides an excellent interface. The high k dielectric may be formed in a low temperature deposition process utilizing an organic precursor such as an alkoxide precursor for the $HfO_2$ deposition in an atomic layer deposition (ALD) process. The metal gate, formed with electron beam evaporation or sputtering, may be a platinum, tungsten, palladium, molybdenum or other metals.

The EOT, as shown to the right of the structure of FIG. 1, includes approximately 4 Å associated with the upper surface of the silicon 10, resulting from defects near the surface of the monocrystalline structure. Above this, approximately 5 Å of silicon dioxide region 11 is shown. Then, the high k dielectric is formed in the ALD process, its EOT is 3-4 Å. The resultant EOT for the structure shown in FIG. 1 is 12-13 Å.

To the left of the structure of FIG. 1, the physical thickness (PT) of the regions is shown. As can be seen, the high k dielectric is relatively thick (approximately 20 Å) when compared to the $SiO_2$ region 11. This relatively thick region allows the formation of a reliable, high quality dielectric with a low EOT (3-4 Å).

As mentioned earlier, it is difficult to produce the corresponding interface to the structure of FIG. 1, where a Group III-V compound is used. The oxide formed from these compounds are of poor quality, and do not adhere well to the high k dielectric.

Figure 2:
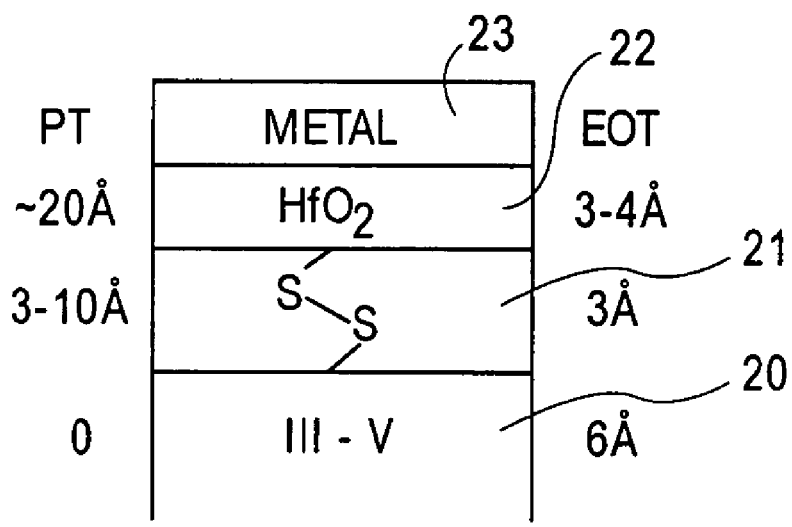
FIG. 2 illustrates the interface between a Group III-V confinement region and a metal gate, including a high k dielectric and a chalcogenide region as described below.

In FIG. 2, the interface, more fully described below, between a Group III-V compound and a high k dielectric is illustrated. A Group III-V region 20 is illustrated with the bridging sulfur (S) atoms of the interface region 21, as one embodiment of a chalcogenide interface region. As will be described, these bridging atoms allow a better match to the high k dielectric region 22, illustrated as $HfO_2$ for one embodiment.

Figure 3:
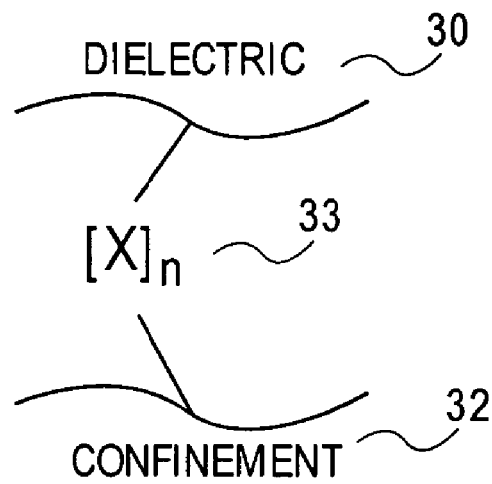
FIG. 3 illustrates a confinement region interfaced with a high k dielectric through a chalcogenide region.

The EOT for the structure of FIG. 3 includes approximately 6 Å associated with the upper surface of the Group III-V compound, such as a confinement region 20, and particularly, native oxides on this region which are not entirely removed as well as lattice defects in the confinement region. The interface 21 may be a chalcogenide such as oxygen (O), S, selenium (Se), tellurium (Te)). (The heavier chalcogenide polonium (Po) is not favored because of its radioactivity.) The EOT of the interface region 21 is approximately 3 Å for the illustrated embodiment, corresponding to a few atomic layers. The PT for this region is 3-10 Å. Above this, a high k dielectric region 22 is formed having a PT of approximately 20 Å and an EOT of 3-4 Å. Finally, a metal gate 23, similar to the metal gate 13 of FIG. 1, is used.

In a typical transistor, a quantum well of, for instance, InSb is confined between metamorphic buffer or confinement layers (e.g. AlInSb). These layers have a higher band gap than the well to mitigate the effects of the narrow band gap of the quantum well on device leakage and breakdown.

In FIG. 3, the chalcogenide interface region is again shown between dielectric region 30 and a Group III-V confinement region 32. The chalcogenide is represented by "X," with the number of atomic layers shown as "n." For oxygen, n is typically greater than 1, for example, three. A sterically bulky oxidizing agent (e.g. di-tert-butyl peroxide or di-iso-propyl-peroxide) may be used to deliver an o-containing substituent with a bulky leaving group (e.g. O-t Bu) which also reacts favorably with a standard ALD precursor. This prevents further reactivity with the atmosphere. The S or Se is preferably equal to 1, 2 or 3. This film may deposited from a monovalent dimer. Any one of a plurality of di-organic di-chalcogenide species can be used.

Figure 5:
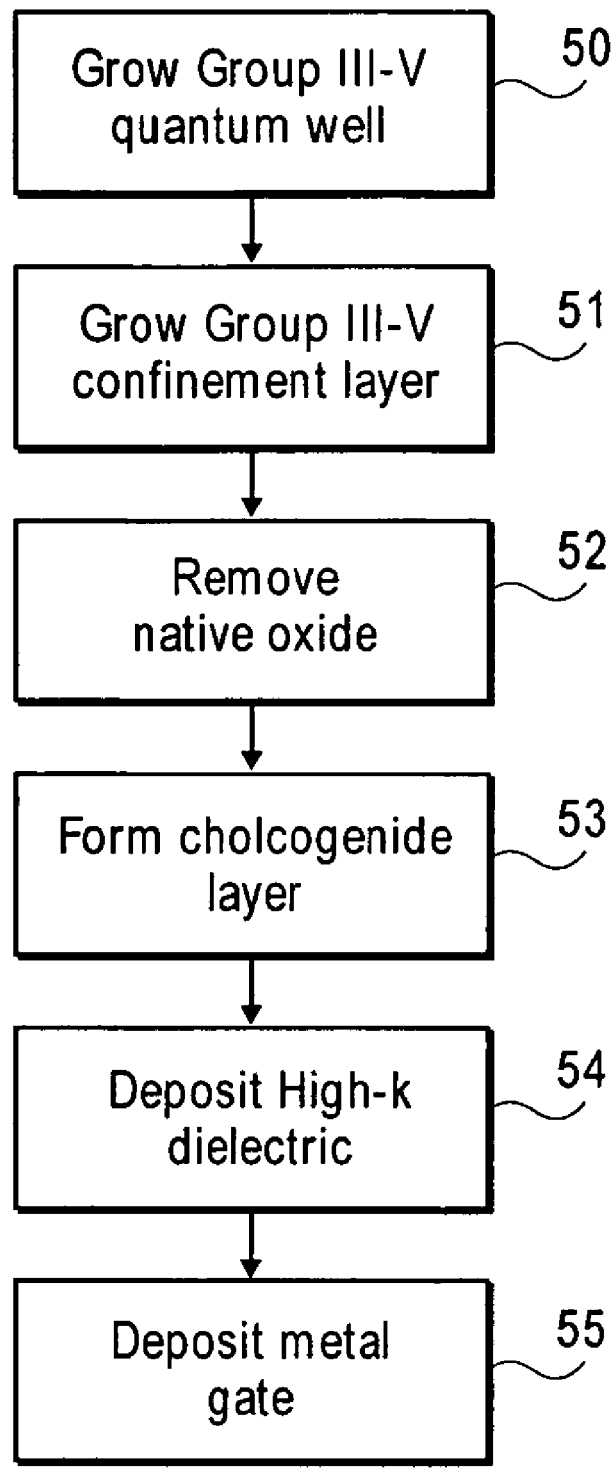
FIG. 5 illustrates the process carried out for forming a metal gate in a Group III-V semiconductor device.

In FIG. 5, a process is illustrated beginning with the growth of the Group III-V quantum well 50 which typically occurs over a first confinement layer. Again, as mentioned, the Group III-V well may comprise InSb or InP. As mentioned, in another process 51, the confinement region or layer is formed on the quantum well. This corresponds to, for instance, region 20 of FIG. 2. The confinement layers are typically a material compatible with the well, however with a larger bandgap. For a well of InSb, the metalloid AlInSb may be used. The processes 50 and 51 may be carried out using molecular beam epitaxy or metal organic chemical vapor deposition, by way of example.

Prior to forming a chalcogenide layer, the native oxide and any other oxide on the confinement layer are removed. The process 52 of FIG. 5 may be carried out by treating the surface with an acid, for instance, citric acid, HCl or HF.

Figure 4A:
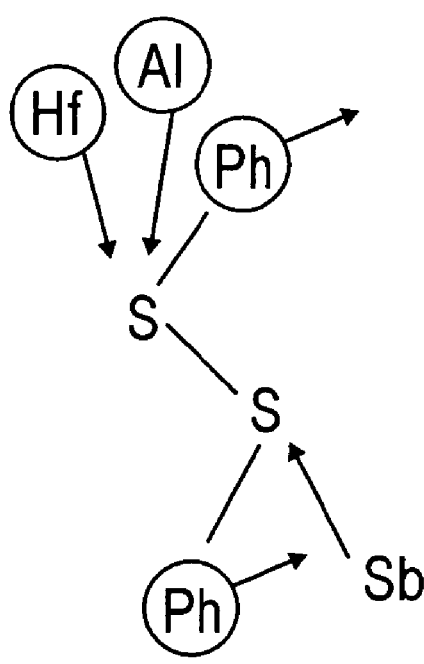
FIG. 4A illustrates a diphenyl-disulfide compound, with the phenyls being replaced.
Figure 4B:
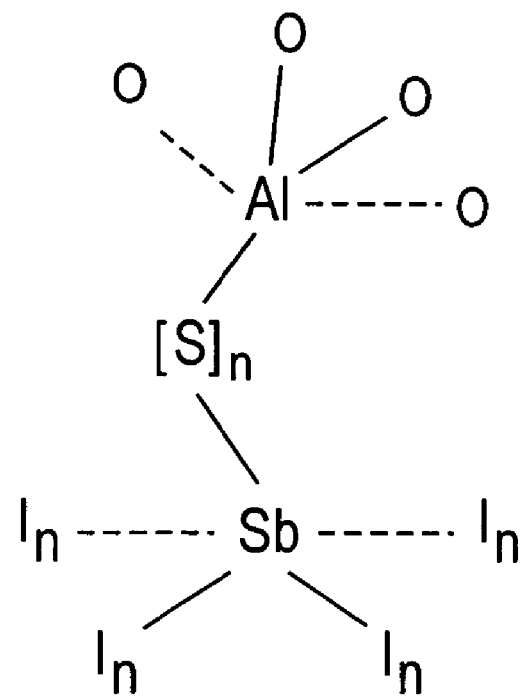
FIG. 4B illustrates the compound of FIG. 4A in place between the confinement region and a high k dielectric.

Next, as shown by process 53, the chalcogenide layer is formed. This formation is shown for one embodiment in conjunction with FIGS. 4A and 4B. In FIG. 4A, a compound of di-phenyl-disulfide is shown which ultimately leaves a chalcogenide film juxtaposed between the metalloid-containing Group III-V confinement region and high k dielectric. Other di-chalcogenide may be used such as di-selenide. Moreover, other precursors such as a benzene ring, or the like may be used. In the case of the di-phenyl, one phenyl is shown displaced by an antimony atom of the confinement layer, and the other with, for instance, Hf or Al atom from one of the precursors used in the formation of the high k dielectric. This leaves, as shown in FIG. 4B, the S bridging atoms where the di-chalcogenide comprises S. Thus, one of the di-phenyl atoms is replaced during the process 53, and the other during the process 54 of FIG. 5, by the precursors for the high k dielectric. The same result can be achieved with the other di-chalcogenide. Ordinary precursors for the formation of the $HfO_2$ or $ZrO_2$ may be used.

In one embodiment, the containment layer is AlInSb, as mentioned. Where this is used, $Al_2O_3$ may be used as the high k dielectric to minimize valence mismatch. The $Al_2O_3$ may be deposited using trimethylaluminum (TMA) and water precursors with an ALD process.

Finally, as shown in FIG. 5, a metal gate deposition 55 occurs. Again, ordinary processing may be used to form the gate. Since the Group III-V material may have a low melting point, for example 525° C. for InSb, ALD is used in one embodiment for the gate deposition. Where $Al_2O_3$ is used as the high k dielectric, an aluminum gate may be used to provide more compatibility.

Figure 6:
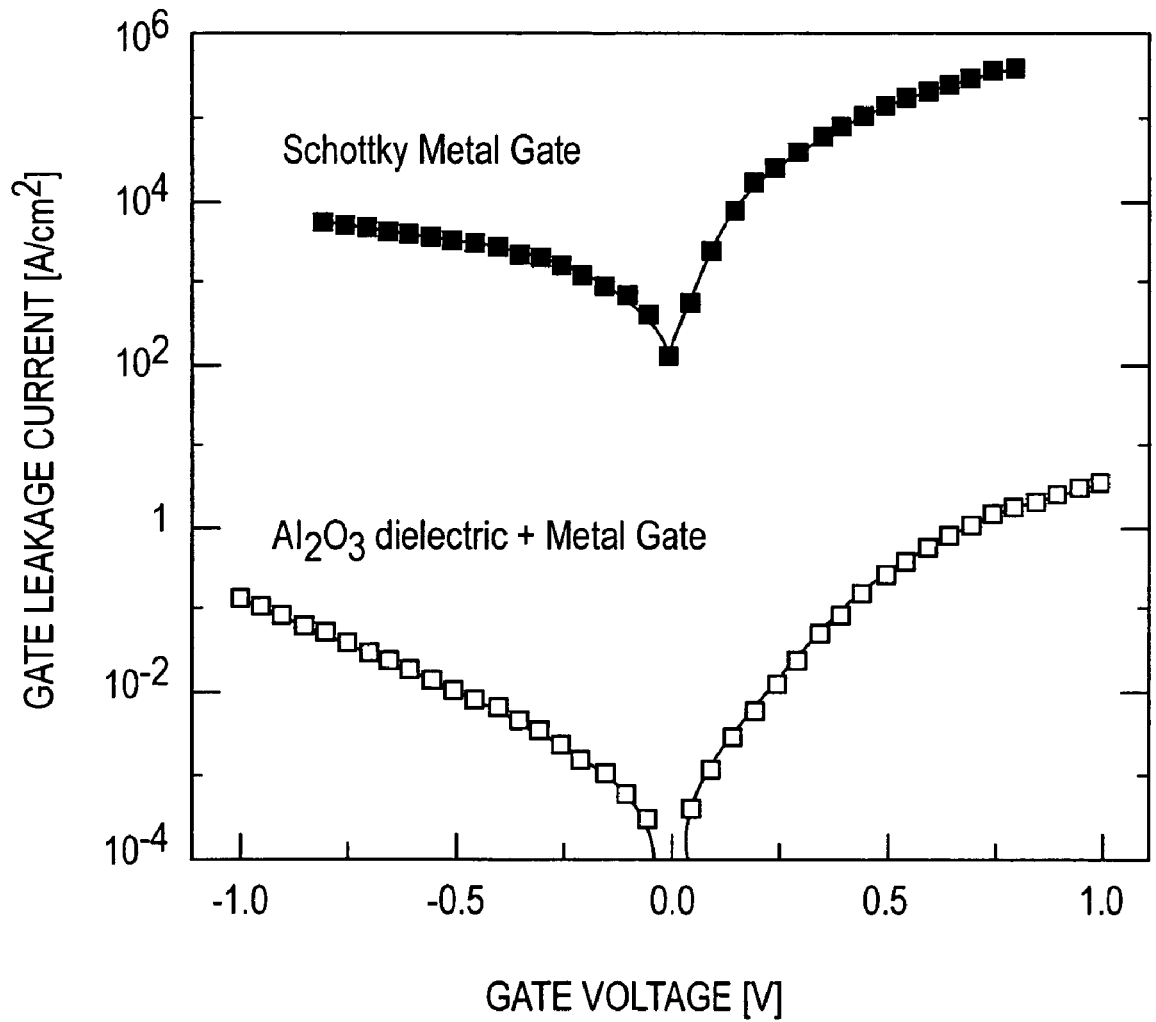
FIG. 6 is a graph illustrating the benefits of using a high k dielectric on the gate leakage when compared to a Schottky metal gate.

FIG. 6 illustrates the reduction in gate leakage obtained by using a high k dielectric such as $Al_2O_3$ and a metal gate, as opposed to a Schottky metal gate. As can be readily seen in FIG. 6, the difference in leakage is several orders of magnitude less with a high k dielectric. The results of FIG. 6 are for an aluminum gate, $Al_2O_3$ dielectric, AlInSb confinement layer and an InSb quantum well.

Figure 7:
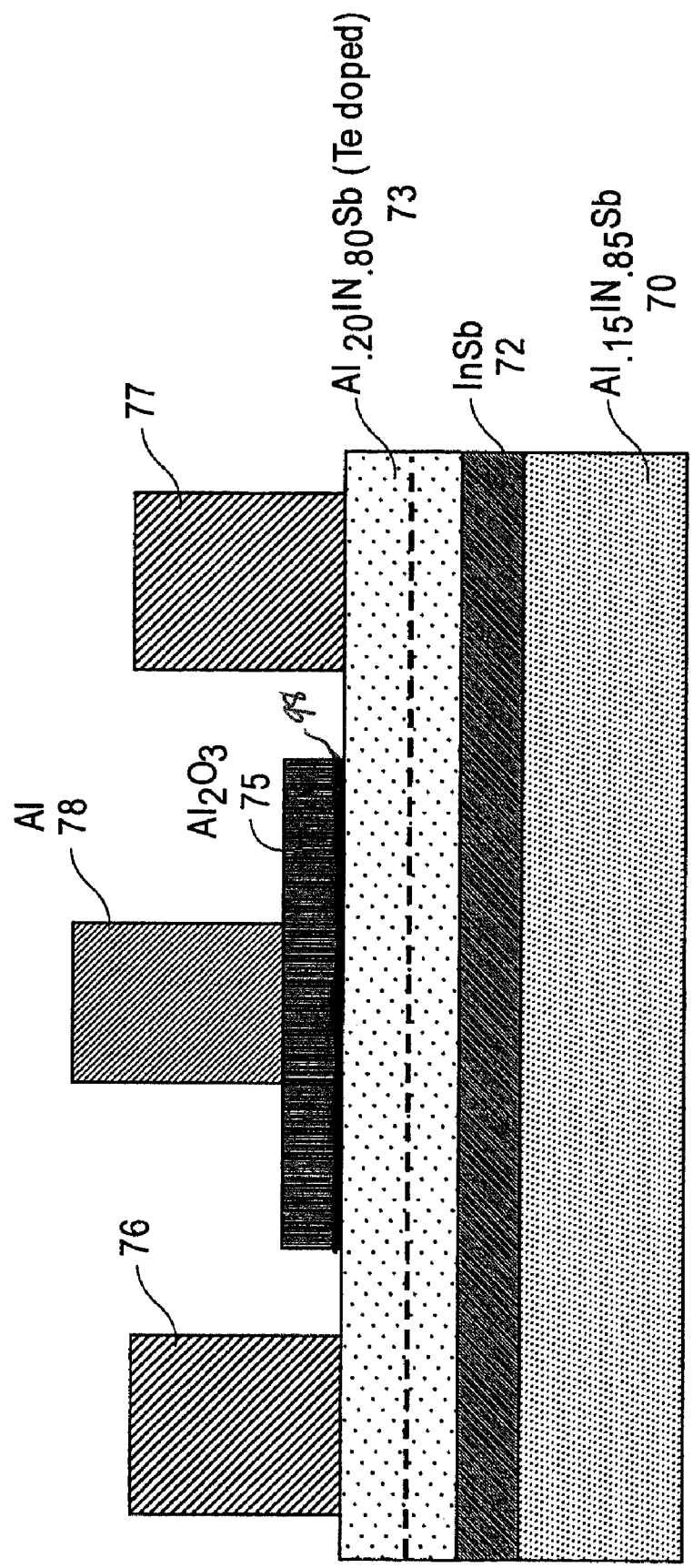
FIG. 7 is a cross-sectional, elevation view of a semiconductor device with an alumina ($Al_2O_3$), high k dielectric layer.

FIG. 7 illustrates the structure of a transistor that may be fabricated with the above-described processing. This embodiment is particularly suitable for a depletion mode-like device since, for instance, when the gate is not embedded into the confinement layer as it is for the device of FIG. 8. A lower containment region, in one embodiment, comprising a $Al_{0.15}In_{0.85}Sb$ layer 70 which is formed, for example, on a semi-insulating GaAs substrate. Then, the quantum well 72 of, for instance, InSb is grown on the lower confinement layer. Next, the upper confinement layer 73 comprising, in one embodiment, $Al_{0.20}In_{0.80}Sb$ is formed. This layer includes a donor region, more specifically, in one embodiment, a Te doped region. The Te doping supplies carriers to the quantum well 73. The multilayer structure of FIG. 7 may be grown using molecular beam epitaxy or metal organic chemical vapor deposition. The doped donor region is formed by allowing Te (or Si) dopants to flow into the molecular beam epitaxy chamber from, for example, a solid source.

The thickness of the layer 73, along with the work function of the gate 78, determine the threshold voltage of the transistor, and as mentioned earlier, provide for the embodiment of FIG. 7, a depletion mode-like device. A lower work function is thus selected for the gate to reduce the threshold voltage. A source contact 76 and drain contact 77 are also illustrated in FIG. 7, along with an aluminum gate 78. By way of example, in one embodiment, layer 70 may be 3 μm thick, the quantum well 72 may be 20 nm thick, the confinement layer 73 may be 5 nm thick, and the Te, δ-doped donor region may be doped to a level of $1-1.8 \times 10^{12}$ $cm^{-2}$, μ equal to 18-25000 $cm^{-2}v^{-1}s^{-1}$ with a gate length of 85 nm. Also depicted in FIG. 7 is a chalcogenide region 98, such as a disulfide or diselenide region, below $Al_2O_3$ dielectric layer 75.

Figure 8:
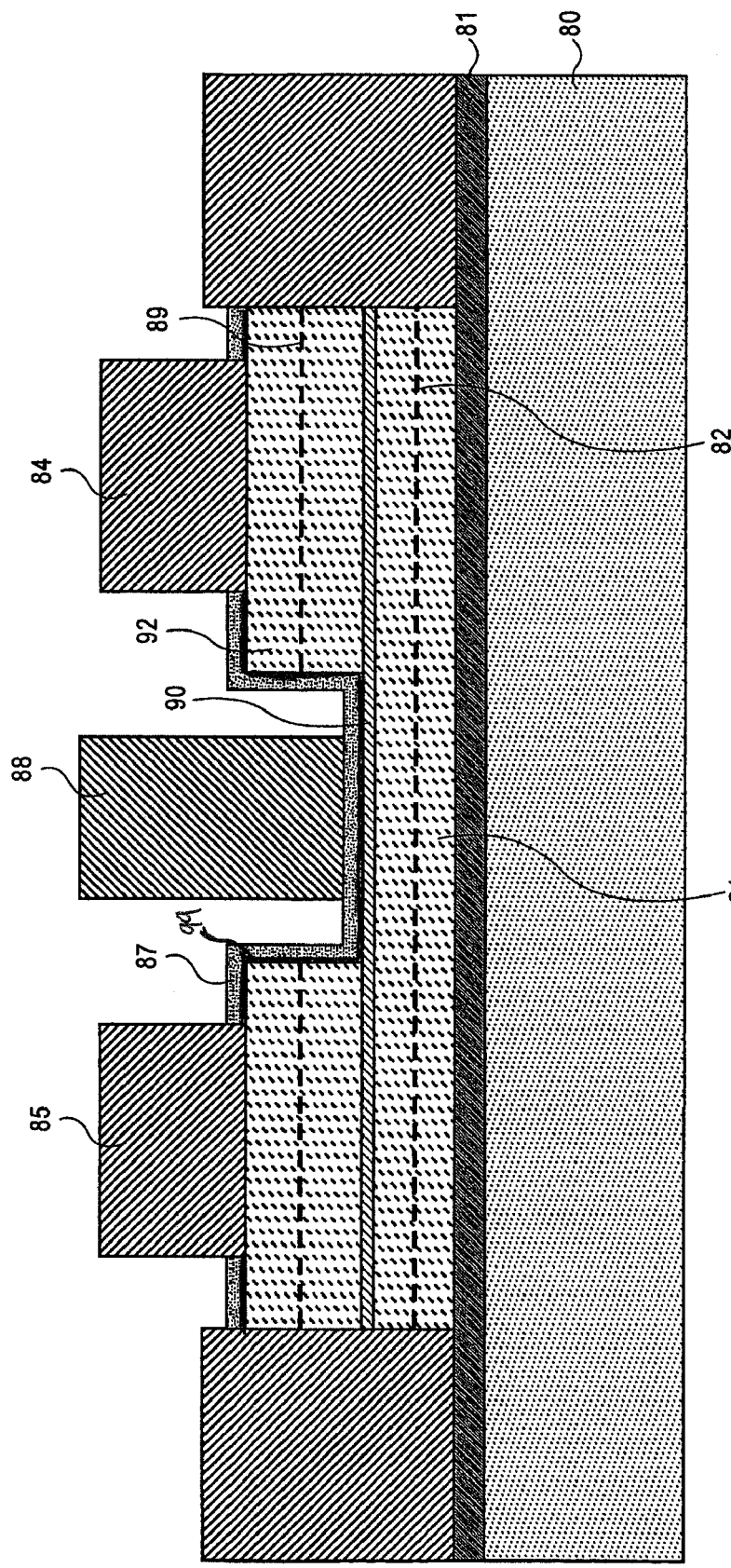
FIG. 8 is a cross-sectional, elevation view of a Group III-V semiconductor device with a high k dielectric and a recessed metal gate.

FIG. 8 illustrates another embodiment with a recessed gate for increasing the voltage threshold to provide a more enhancement mode-like device. Again, there is a higher band gap, lower confinement layer 80, a quantum well 81, and two doped upper confinement layers 91 and 92 separated by an etchant stop layer 90. Both layers 91 and 92 are doped as shown by the δ doping planes 82 and 89, respectively. The high k dielectric 87 is recessed into the layer 92 as is the metal gate 88. It is this recessing and the selection of the work function metal for the gate 88 which provides the increased threshold voltage. The layer thicknesses, doping levels, etc. may be the same as for the embodiment of FIG. 7. The additional layer 92 may be a thickness of 45 nm. Also depicted in FIG. 8 is a chalcogenide region 99, such as a disulfide or diselenide region, below high k dielectric 87.

Thus, an interface in several embodiments, between a Group III-V confinement region and a high k dielectric region has been described along with devices using the interface.

What is claimed is:

1. A method for fabricating a semiconductor device comprising:
    growing a first region of a Group III-V compound;
    growing a confinement region on the first region;
    forming a disulfide bridge or diselenide bridge region on the confinement region;
    forming a dielectric region on the disulfide bridge or diselenide bridge region, wherein one atom of the disulfide bridge or diselenide bridge is bonded directly to the dielectric region but is not bonded directly to the confinement region, and wherein the other atom of the disulfide bridge or diselenide bridge is bonded directly to the confinement region but is not bonded directly to the dielectric region; and
    forming a metal gate on the dielectric region.

2. The method of claim 1, including removing a native oxide from the confinement region prior to forming the disulfide bridge or diselenide bridge region.

3. The method of claim 2, wherein the native oxide is removed by an etchant selected from the group consisting of citric acid, HCl and HF.

4. The method of claim 1, wherein the dielectric region comprises a high-k dielectric.

5. The method of claim 4, wherein the high-k dielectric comprises $HfO_2$.

6. The method of claim 1, wherein the disulfide bridge or diselenide bridge region is formed by using a precursor selected from the group consisting of a di-organic di-sulfide and a di-organic di-selenide.

7. The method of claim 1, wherein the first region comprises InSb or InP.

8. A semiconductor device comprising:
    a compound of Group III-V elements in a first region;
    a confinement region having a wider band gap than the first region;
    a disulfide bridge or diselenide bridge region disposed on the confinement region;
    a dielectric region disposed on the disulfide bridge or diselenide bridge, wherein one atom of the disulfide bridge or diselenide bridge is bonded directly to the dielectric region but is not bonded directly to the confinement region, and wherein the other atom of the disulfide bridge or diselenide bridge is bonded directly to the confinement region but is not bonded directly to the dielectric region; and
    a metal gate disposed on the dielectric region.

9. The semiconductor device of claim 8, wherein the dielectric region comprises a high-k dielectric.

10. The semiconductor device of claim 9, wherein the high-k dielectric comprises $HfO_2$.

11. The semiconductor device of claim 8, wherein the first region comprises InSb or InP.

* * * * *